US006542380B1

(12) United States Patent
Hailey et al.

(10) Patent No.: US 6,542,380 B1
(45) Date of Patent: Apr. 1, 2003

(54) DIELECTRIC COUPLING OF ELECTROMAGNETIC ENERGY TO AN EXTERNAL CURRENT RETURN PATH

(75) Inventors: Jeffrey C. Hailey, Austin, TX (US); Todd W. Steigerwald, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 09/978,316

(22) Filed: Oct. 15, 2001

(51) Int. Cl.[7] .................................................. H05K 7/14
(52) U.S. Cl. ........................ 361/799; 361/765; 361/802; 361/816; 174/35 R; 174/256
(58) Field of Search ................................ 361/799, 738, 361/753, 763, 766, 782, 794, 818, 821, 767, 765, 748, 771, 816; 174/122 G, 256, 35 R; 257/788, 794

(56) References Cited

U.S. PATENT DOCUMENTS

| | | | | | |
|---|---|---|---|---|---|
| 4,885,431 A | * | 12/1989 | Kawakami et al. | ........... | 174/36 |
| 5,350,594 A | * | 9/1994 | Unruh | ........................ | 427/410 |
| 5,394,304 A | * | 2/1995 | Jones | ........................ | 174/256 |
| 5,694,300 A | * | 12/1997 | Mattei et al. | ............. | 174/35 R |
| 6,097,613 A | * | 8/2000 | Batten et al. | ............. | 174/35 R |
| 6,353,540 B1 | * | 3/2002 | Akiba et al. | ................. | 174/255 |

OTHER PUBLICATIONS

U.S. Patent Application entitled "Digital Circuit Decoupling for EMI Reduction;" inventors Jeffrey C. Hailey and Todd W. Steigerwald; Ser. No. 09/491,290; filled Jan. 25, 2000; Notice of Allowance and Issue Fee Due mailed Aug. 28, 2001.

* cited by examiner

Primary Examiner—David Martin
Assistant Examiner—Hung Bui
(74) Attorney, Agent, or Firm—Baker Botts L.L.P.

(57) ABSTRACT

A Method and system of routing noise current from noise generating devices in an electronic or electrical system is disclosed. The method and system includes dielectric structures that route noise current from noise generating devices back to the noise generating device in which the noise originates by way of a return path. The dielectric structures provide for the return paths.

13 Claims, 8 Drawing Sheets

DIELECTRIC COUPLING OF ELECTROMAGNETIC ENERGY TO AN EXTERNAL CURRENT RETURN PATH

BACKGROUND OF THE INVENTION

1. Field of the Invention

This invention relates to a method and system for coupling electromagnetic energy from an active device to current return paths in a manner that reduces emanated noise current by returning noise current to a common ground of the generating active device.

2. Description of the Related Art

Self-contained electronic systems, in particular systems housed in metal cases, have active devices mounted on printed circuit boards (PCB). PCBs often act as common ground for such active devices. Common ground provides for current generated by active devices to return or complete a current loop back to current generating devices. Examples of self contained electronic systems include personal computers (PC), high-end audio/video devices, and electrical test equipment. Active devices in these systems include very large-scale integrated (VLSI) circuits having a number of switching transistors. Such VLSI components generate a measurable amount of electromagnetic energy, in particular noise current. An amount of noise current is directly returned back to the active device. Some noise current is radiated and returned to the PCB which holds the active device. Further, an amount of the noise current radiates into free space between the metal case and the active device. Noise current that is not returned directly back to the active device nor returned back to the PCB, either is returned through the metal case or is returned to common ground by way of adjacent devices. Any noise current that is not directly returned to the active device can lead to an increase in electromagnetic interference (EMI). EMI is strictly regulated by agencies such as the Federal Communication Commission. The radiated noise current that is returned by way of adjacent devices can lead to faulty operation of adjacent devices, including data processing errors.

Referring now to FIG. 1, a block diagram illustrates a multi-device electronic system. Active devices 100, 105, and 110 are mounted on a PCB 115. PCB 115 acts as common ground. Active devices 100, 105, and 110 generate noise current 120. Noise current 120 completes a current loop directly back to respective noise current generating active devices 100, 105, and 110. Noise current 125 is radiated from respective devices 100, 105, and 110 and is returned back to common ground PCB 115. Noise current 130 is current that is radiated from the respective active devices 100, 105, and 110 that is not returned directly to the originating device nor is returned directly to PCB 115. Noise current 130 returns to common ground PCB 115 by way of metal case 140 or by way of adjacent devices.

Referring now to FIG. 2, an electrical circuit illustrates current that is generated by an active device in a multi-device system. The active device acts as voltage source 200. Radiation resistance 220 is in series with voltage source 200. In parallel with voltage source 200 are impedances Z1 205, Z2 210, and Z3 215. Impedance Z1 205 represents the impedance of current that directly loops back to voltage source 200; this current is represented as current noise 120 of FIG. 1, and is current that does not leave device 100. Impedance Z2 210 represents the impedance of the current that loops back to voltage source by way of common ground. Common ground is represented by PCB 115, and the current is represented by current noise 125. Impedance Z3 215 represents the impedance of the current that travels through air and is directed back to common ground by way of a metal case or by way of adjacent devices; this current is represented as current noise 130 of FIG. 1.

In an effort to eliminate active device generated noise current from affecting adjacent devices, implementation has been made of shields, shielding devices, and cans (shields or cans). Such shields and cans are placed over individual active devices and act as conductive return paths that provide current return loops to the PCB common ground and to the originating active device.

Now referring to FIG. 3, a block diagram illustrates a multi-device electronic system implementing shielding structures. Active devices 100, 105, and 110 are noise current generating devices. A shield or a can 300 is placed over device 100; a shield or a can 305 is placed over device 105; and a shield or a can 310 is placed over device 110. Shields and cans 300, 305, and 310 contain the current within their structure, effectively making a very short current return path to the originating active device. Shields and cans 300, 305, and 310 effectively decrease the distance "d" of the parallel plate capacitance equation with a result of increasing capacitance, in effect increasing coupling and providing a return path to the originating active device. The result is the drawing of noise current back to the originating noise current device by way of shields and cans 300, 305, and 310. Radiated noise current 130 is greatly reduced or eliminated, with noise current 130 returned back to the respective originating active device.

These practices of enclosing active devices; however, have drawbacks and problems, including the impracticability of completely enclosing the active device, due to external connections, ventilation requirements, serviceability needs, and fabrication feasibility.

Adding a localized shield or can over an active device requires additional engineering design. A shield or can potentially reduces or cuts off air-flow to the device leading to the risk of overheating. Further a can requires space on PCBs for connection and adds manufacturing steps. Shields or cans add difficulty to servicing the device, and because of their conductive nature, risk creating short-circuits on the product. Further, shields or cans are dependent upon preexisting, and potentially inadequate, current return paths of the system.

SUMMARY OF THE INVENTION

What is needed and is disclosed herein is an invention that provides for a method and a system to effectively reduce radiated electrical magnetic energy from affecting devices in a multi-device electronic system, and to provide adequate current return path to active devices that originate the current.

In one embodiment of the invention, a dielectric structure is provided to a noise current generating device where the dielectric structure and the noise generating device are connected to a common ground, and radiated noise current follows a return path from the dielectric structure to the common ground.

Certain embodiments of the invention provide common dielectric structures for a number of noise generating devices, and individual common dielectric structures for individual noise generating devices.

In other certain embodiments of the invention, dielectric structures are placed directly onto noise generating devices. Alternatively in other embodiments, dielectric structures and noise generating devices have a certain amount of space between them.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and it's numerous objects, features and advantages made apparent to those skilled in the art by referencing the accompanying drawings. The use of the same reference number throughout the figures designates a like or similar element.

Figure 1:
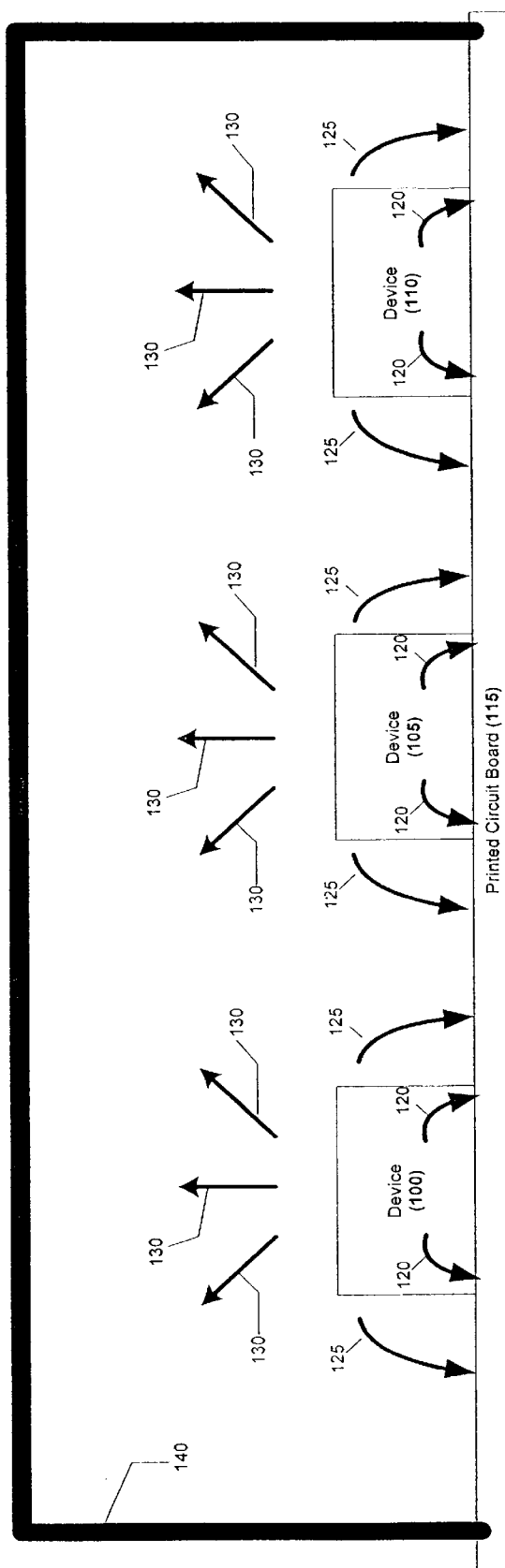
FIG. 1 is a block diagram illustrating a multi-device electronic system.
Figure 2:
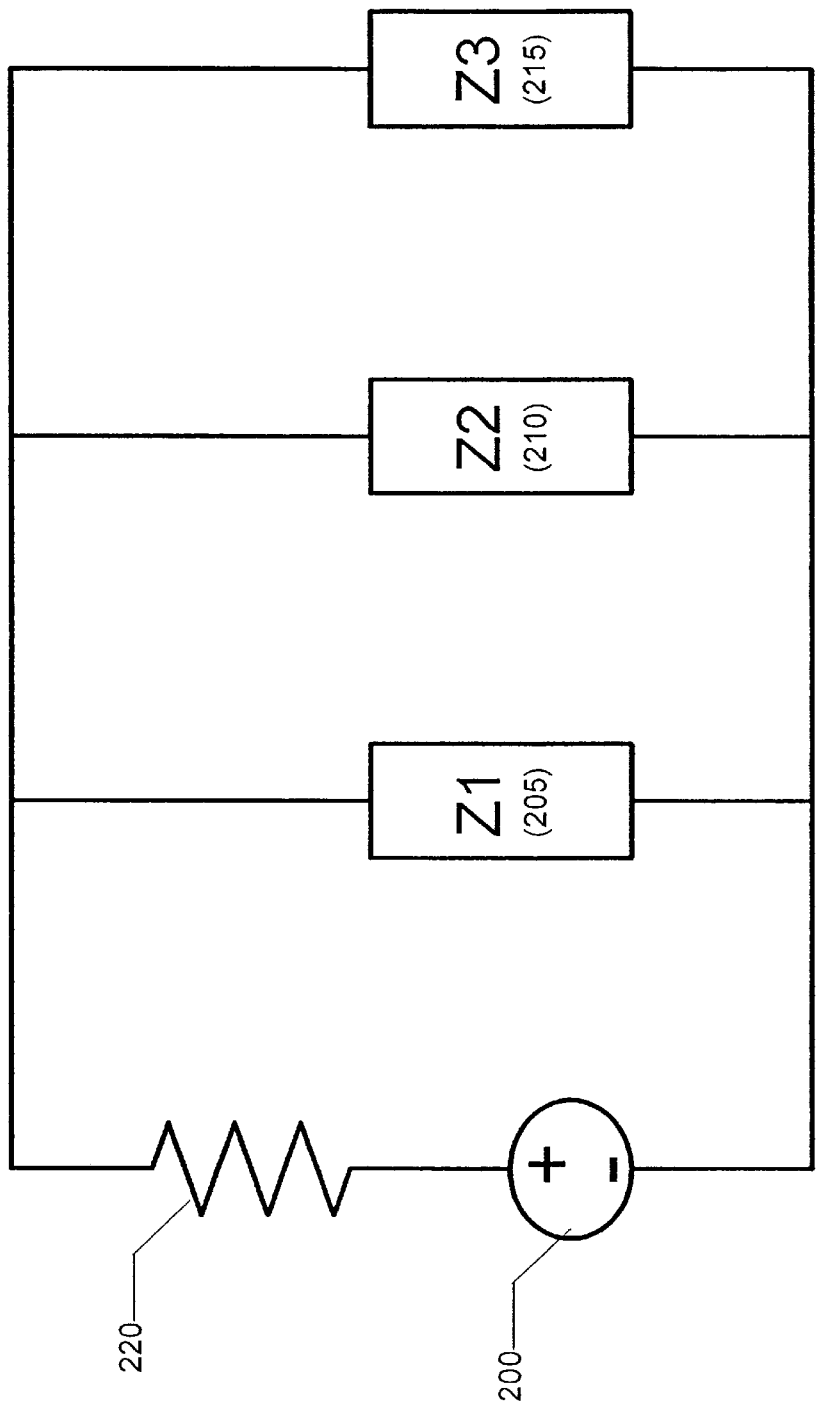
FIG. 2 is an electrical circuit illustrating current generated by an active device in a multi-device electronic system.
Figure 3:
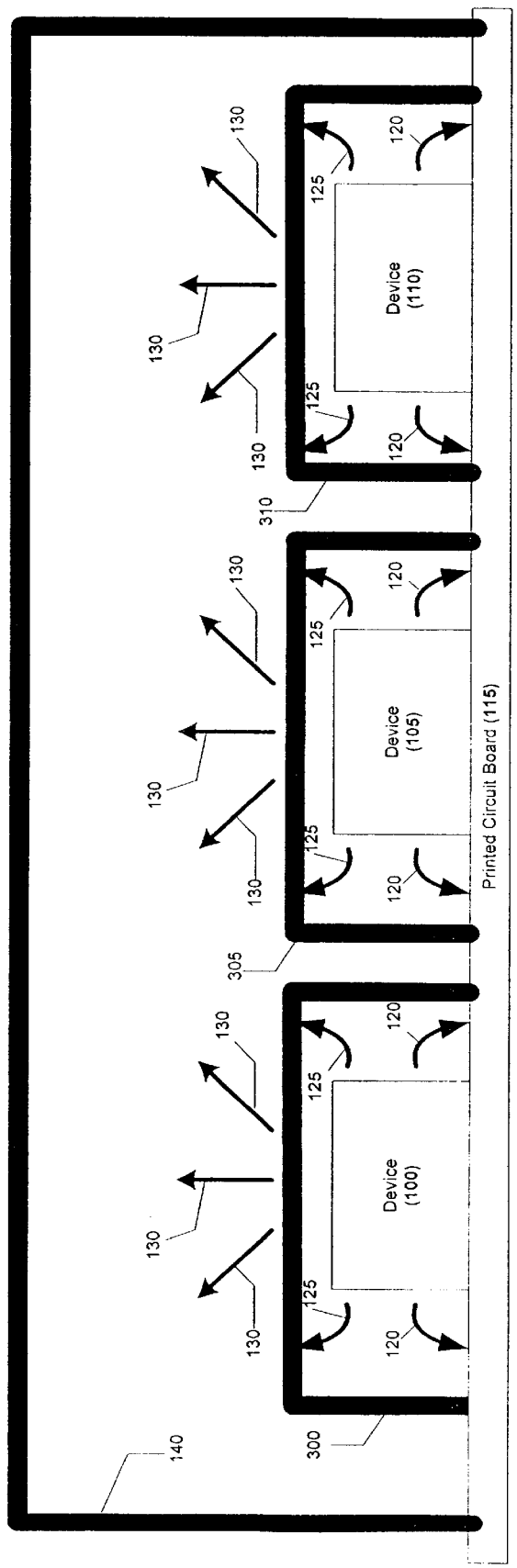
FIG. 3 is a block diagram illustrating a multi-device electronic system implementing shields or cans.

While the invention is susceptible to various modifications and alternative forms, specific embodiments thereof are shown by way of example in the drawings and will herein be described in detail, it should be understood, however, that the drawings and detailed description thereto are not intended to limit the invention to the particular form disclosed but on the contrary, the intention is to cover all modifications, equivalents, and alternatives falling within the scope of the present invention as defined by the appended claims.

DETAILED DESCRIPTION

The following is intended to provide a detailed description of an example of the invention and should not be taken to be limiting of the invention itself. Rather, any number of variations may fall within the scope of the invention which is defined in the claims following the description.

Introduction

The present invention provides a method and system to reduce or eliminate radiating energy, particularly noise current, in a multi-device electronic system by providing dielectric material between noise current generating devices and metal case enclosing the devices. The dielectric material in effect provides a safe and effective return path for radiated noise current to return to common ground or in the PCB in which the active devices are mounted. The dielectric material effectively increases the capacitance between the active devices and the metal case, in effect increasing the coupling of the noise current between the active devices and the metal case. Dielectric material is placed on top of the active devices and requires no added space on the PCB. Separate or single dielectric structures can be made available to the active devices in the system. Such dielectric structures are designed around the multi-device electronic system architecture.

The following equation describes capacitance between two parallel plates for a dielectric medium:

$$C = \epsilon_0 * \epsilon_r [A/d]$$

"C" is defined as capacitance. "$\epsilon_0$" is defined as the relative permitivity of air. "$\epsilon_r$" is defined as the relative permitivity of a dielectric (relative to air). "A" is defined as the surface area of a dielectric. "d" is defined as the distance (thickness) of the dielectric. To increase coupling in a return path, capacitance is increased. In the case of an active device in a multi-device system, surface area value "A" is constrained by the surface area of the active device.

Various materials can be used for the dielectric structures. Choice of material is dependent on particular use, manufacturing, application, and cost constraints. Any material that is chosen will have a relative permitivity greater than air (vacuum), so virtually any material can be used for the dielectric material. The following table list examples of dielectric materials and their respective relative permitivities. The table represents information from the book "Field and Wave Electromagnetics" by David K. Cheng, published by Addison-Wesley, 1985.

| MATERIAL | Approximate Relative Permitivity |
| --- | --- |
| PCB Material | $\epsilon_r$~4.2 |
| Teflon ® | $\epsilon_r$~2.1 |
| Plexiglass | $\epsilon_r$~3.4 |
| Bakelite ® | $\epsilon_r$~5.0 |
| Porcelain | $\epsilon_r$~5.7 |
| Mica | $\epsilon_r$~6.0 |
| Glass | $\epsilon_r$~4.0–10.0 |
| Ceramic | $\epsilon_r$~12.0 |

Figure 4:
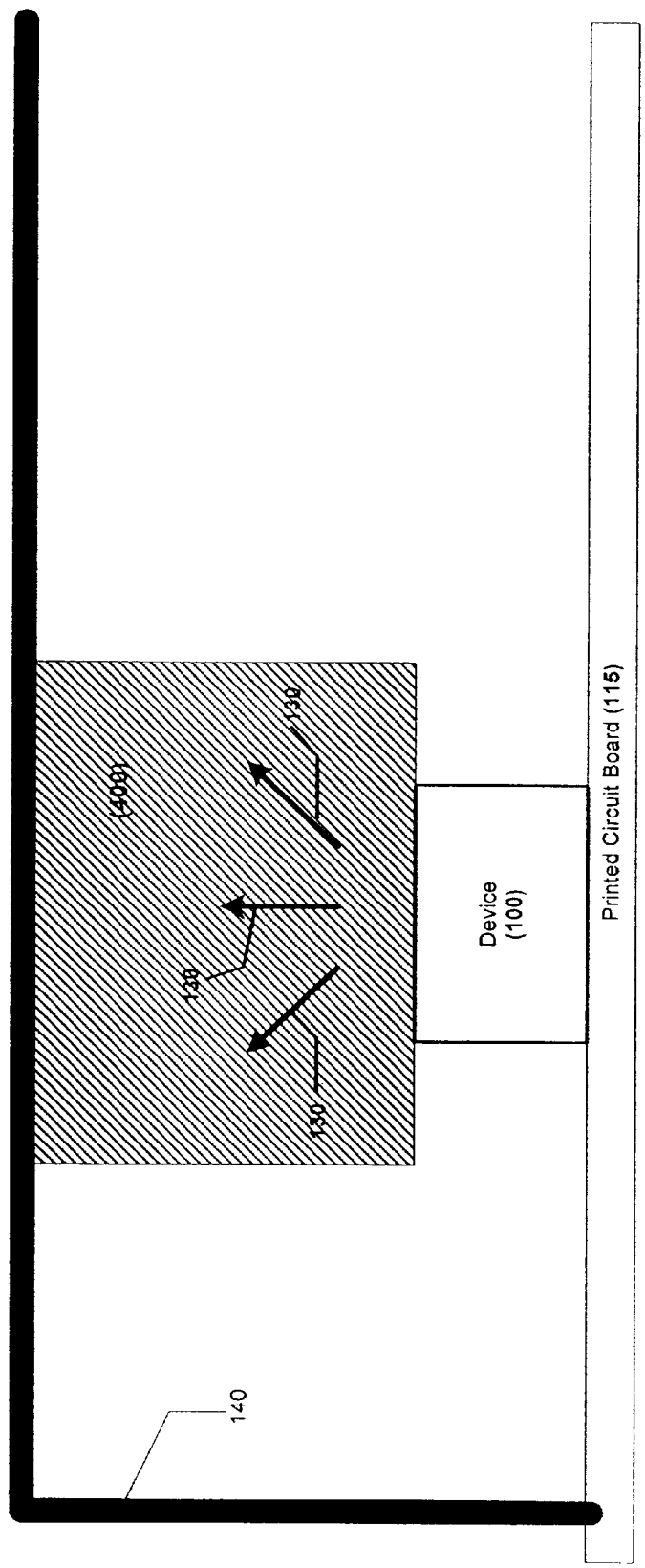
FIG. 4 is a block diagram illustrating the use of a dielectric structure for a particular active device in a multi-device electronic system.

Now referring to FIG. 4, a block diagram illustrates the use of a dielectric structure for a particular active device in a multi-device electronic system. An active device 100 is placed on a PCB 115. PCB 115 is a common ground to the multi-device electronic system. Return path 135 to the PCB 115 can use be provided. Dielectric 400 is placed between active device 100 and metal case 140. Dielectric 400 is a structure that covers the entire area of active device 100. Dielectric 400 increases the capacitance between active device 100 and metal case 140. The effect is an increase in current coupling between active device 100 and metal case 140. Radiated noise current 130 from active device 100 returns by way of dielectric 400 to metal casing 140 and to common ground PCB 115.

Figure 5:
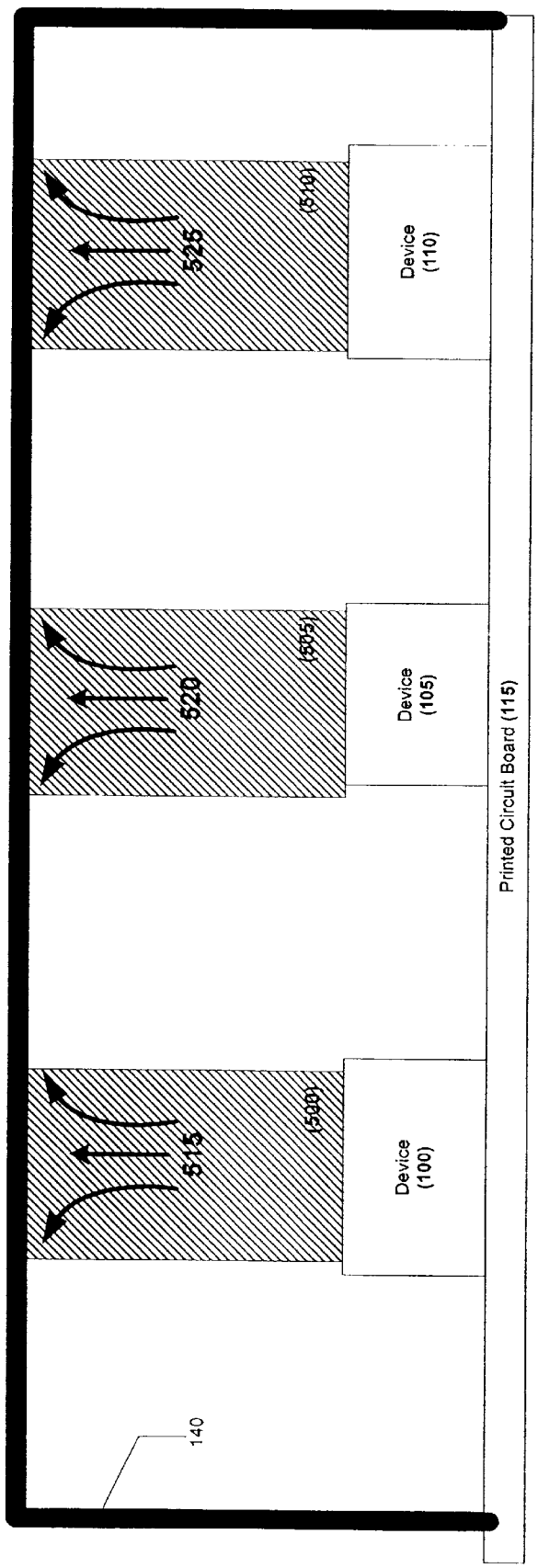
FIG. 5 is a block diagram illustrating the use of individual dielectric returns in a multi-device electronic system.

Now referring to FIG. 5, illustrated is a multi-device electronic system with individual dielectric structures used as current returns. Dielectric structure 500 is provided for active device 100. Dielectric structure 505 is provided for active device 105. Dielectric structure 510 is provided for active device 110. An advantage of providing individual dielectric structures allows greater air-flow and cooling within the enclosed system. Certain embodiments of the invention allow dielectric 500 to be placed directly on active device 100, dielectric 505 to be placed directly on active device 105, and dielectric 510 to be placed directly on active device 110. Dielectric structures 500, 505, and 510 can be placed as conformal structures onto active device 100, 105, and 110. In certain embodiments, an amount of free space can be provided between dielectric structures 500, 505, and 510, and the metal case 140.

The affect of individual dielectric structures 500, 505, and 510 allows radiated noise current 515 from active device 100, radiated noise current 520 from active device 105, and radiated noise current 525 from active device 110, to complete return loops by way of metal case 140 back to common ground 115. Radiated noise current tends to travel back through the respective dielectric of the originating active device instead of radiating and looping back by way of adjacent active devices.

Other embodiments of the invention include placing dielectric structures 500, 505, and 515 directly on the metal case. In such embodiments the dielectric structure can be malleable, conforming to respective individual active devices 100, 105, and 110. In certain embodiments of the invention particular dielectric structures are used for more than one active device. For example, active devices 100 and 105 can share a single dielectric structure instead of being provided individual dielectric structures 515 and 520.

Figure 6:
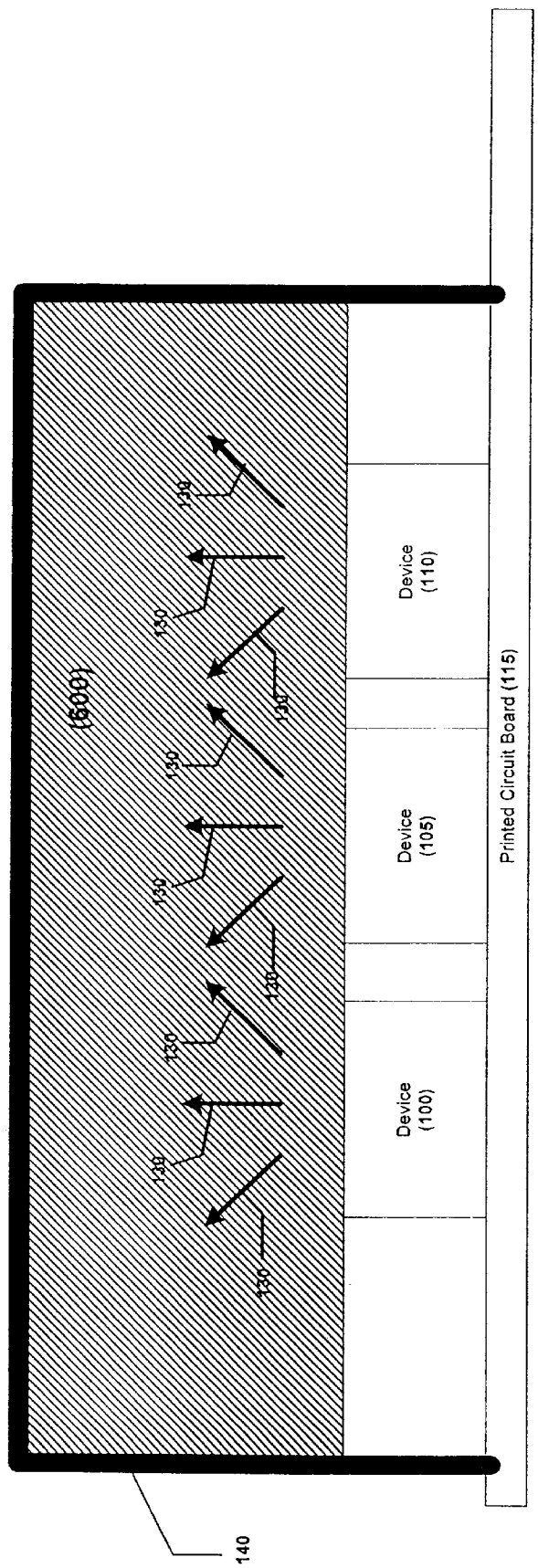
FIG. 6 is a block diagram illustrating the use of a single dielectric return in a multi-device electronic system.

FIG. 6 illustrates a multi-device electronic system that makes use of a single dielectric return. Dielectric 600 is placed between metal case 140 and active devices 100, 105, and 110. Due to the capacitance introduced by dielectric 600, the radiated noise current tends to travel through dielectric 600 instead of radiating back into any of active devices 100, 105, and 110. Embodiments of the invention can provide for modifications of the structure of dielectric 600 can to account for physical design of the metal case 140; system cooling; and placement of the active devices 100, 105, and 110 along with other devices of the system.

Figure 7:
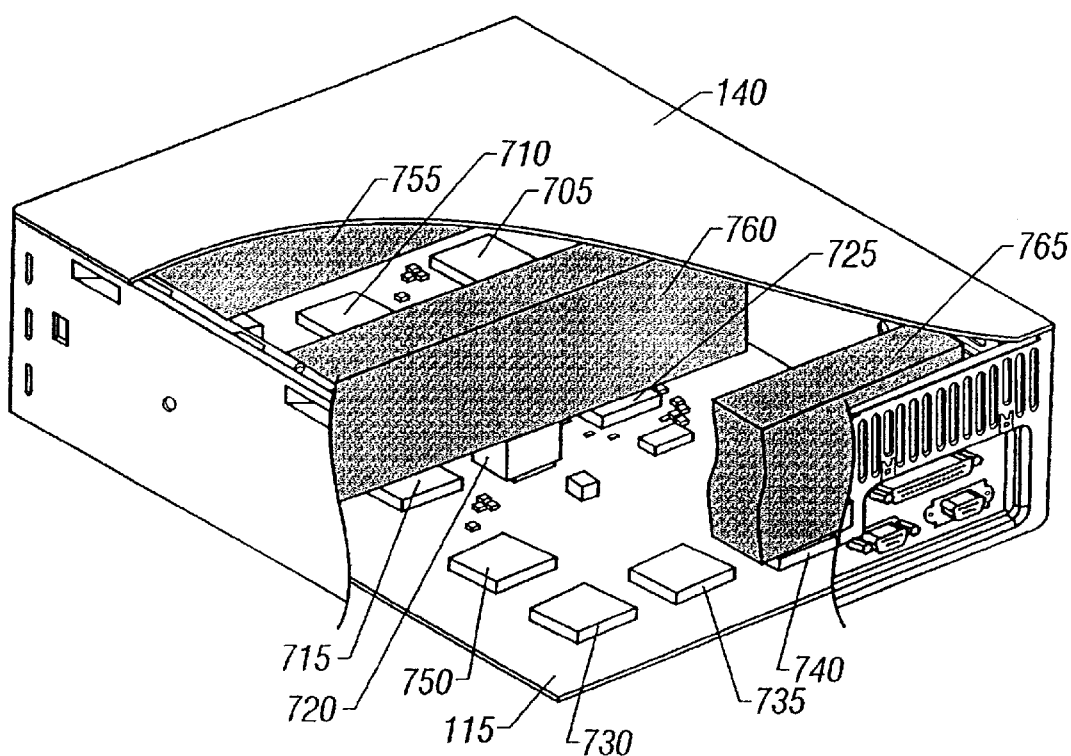
FIG. 7 is a cross sectional profile view of a multi-device electronic system with dielectric returns.

FIG. 7 is a cross sectional profile view of a multi-device electronic system with dielectric returns. Metal case 140 encloses the multi-device electronic system. The multi-device electronic system includes PCB 115 that is directly connected to metal case 140. On PCB 115 are mounted active devices 705, 710, 715, 720, 725, 730, 735, 740, and 750. PCB 115 acts as common ground to metal case 140 and active devices 705, 710, 715, 720, 725, 730, 735, 740, and 750. Dielectric structures 760, 765, and 770 are placed near or on top of active devices 705, 710, 715, 720, 725, 730, 735, 740, and 750. Dielectric structures 760, 765, and 770 provide the return paths of any noise current that is generated by active devices 705, 710, 715, 720, 725, 730, 735, 740, and 750. Placement and configuration of dielectric structures 760, 765, and 770 depend on the design constraints, configuration, and placement of active devices 705, 710, 715, 720, 725, 730, 735, 740, and 750 of the multi-device electronic system.

Figure 8:
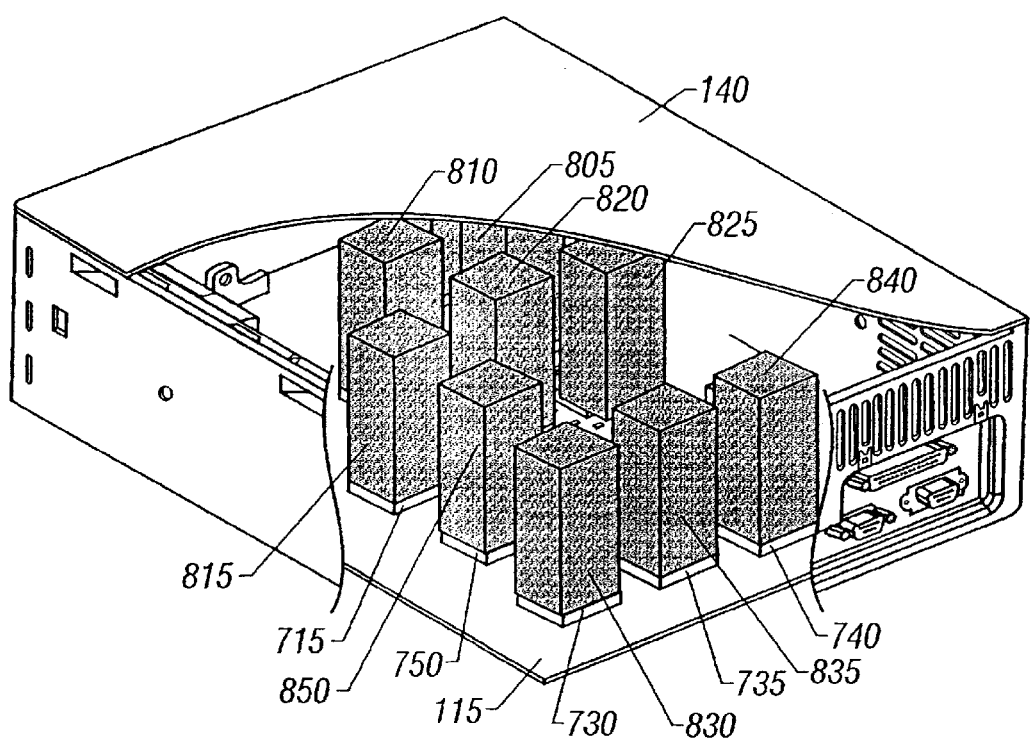
FIG. 8 is a cross sectional profile view of a multi-device electronic system with individual separate dielectric returns.

FIG. 8 is a cross sectional profile view of a multi-device electronic system with individual separate dielectric returns. In this particular embodiment, active devices 705, 710, 715, 720, 725, 730, 735, 740, and 750 have individual dielectric structures that return noise current from the respective active devices. Active device 705 has dielectric structure 805 mounted on top. Active device 710 has dielectric structure 810 mounted on top. Active device 715 has dielectric structure 815 mounted on top. Active device 720 has dielectric structure 820 mounted on top. Active device 725 has dielectric structure 825 mounted on top. Active device 730 has dielectric structure 830 mounted on top. Active device 735 has dielectric structure 835 mounted on top. Active device 740 has dielectric structure 740 mounted on top. Active device 750 has dielectric structure 850 mounted on top. Individual dielectric structures 805, 810, 815, 820, 825, 830, 835, 840, and 850 return the noise current of the respective active devices back to common ground PCB 115.

Although the present invention has been described in connection with several embodiments, the invention is not intended to be limited to the specific forms set forth herein, but on the contrary, it is intended to cover such alternatives, modifications, and equivalents as can be reasonably included within the scope of the invention as defined by the appended claims.

What is claimed is:

1. An electronic system, comprising:
   a plurality of active electronic digital devices;
   a substrate having a ground plane coupled to said plurality of active electronic digital devices;
   a low resistance cover coupled to said substrate ground plane, wherein said low resistance cover and said substrate enclose said plurality of active electronic digital devices; and
   a dielectric structure between said low resistance cover and said plurality of active electronic digital devices, wherein noise current from said plurality of active electronic digital devices is directed through said dielectric structure to said low resistance cover and then through said substrate ground plane back to said plurality of active electronic digital devices.

2. The electronic system of claim 1, wherein said dielectric structure is attached to said low resistance cover.

3. The electronic system of claim 1, wherein said dielectric structure comprises a plurality of dielectric structures.

4. The electronic system of claim 3, wherein each of said plurality of dielectric structures is attached to a respective one of said plurality of active electronic digital devices.

5. The electronic system of claim 3, wherein said plurality of dielectric structures allow airflow to pass therebetween.

6. The electronic system of claim 3, wherein each of said plurality of dielectric structures is associated with a respective one of said plurality of active electronic digital devices.

7. The electronic system of claim 1, wherein said dielectric structure is made of a material having a relative permitivity greater than air.

8. The electronic system of claim 7, wherein the material of said dielectric structure is selected from the group consisting of printed circuit board material (PCB), Teflon (R), Plexiglas (R), Bakelite (R), porcelain, mica, glass and ceramic.

9. The electronic system of claim 1, wherein the electronic system is a computer.

10. The electronic system of claim 1, wherein said dielectric structure is proximate to a face of said low resistance cover and to a face of each of said plurality of active electronic digital devices.

11. A method of directing noise current in an electronic system, said method comprising the steps of:
   providing a plurality of active electronic digital devices;
   providing a substrate having a ground plane coupled to said plurality of active electronic digital devices;
   providing a low resistance cover coupled to said substrate ground plane;
   enclosing said plurality of active electronic digital devices with said low resistance cover and said substrate;
   directing noise current from said plurality of active electronic digital devices through a dielectric structure to said low resistance cover; and
   directing the noise current from said low resistance cover to said substrate ground plane and back to said plurality of active electronic digital devices.

12. The method of claim 11, wherein said dielectric structure comprises a plurality of dielectric structures.

13. The method of claim 12, further comprising the step of passing airflow between said plurality of dielectric structures and said plurality of active electronic digital devices.

* * * * *

UNITED STATES PATENT AND TRADEMARK OFFICE
CERTIFICATE OF CORRECTION

PATENT NO. : 6,542,380 B1
DATED : April 1, 2003
INVENTOR(S) : Jeffrey C. Hailey and Todd. W. Steigerwald It is certified that error appears in the above-identified patent and that said Letters Patent is hereby corrected as shown below:

<u>Title page,</u>
Item [73], Assignee, Dell Products L.P.
       One Dell Way
       Round Rock, Texas 78682-2244

Signed and Sealed this

Seventh Day of September, 2004

JON W. DUDAS
*Director of the United States Patent and Trademark Office*